United States Patent [19]

Kupersmith et al.

[11] Patent Number: 4,811,287

[45] Date of Patent: Mar. 7, 1989

[54] EEPROM MOUNTING DEVICE

[75] Inventors: Bertram F. Kupersmith; Michael B. Herzog; James D. Fraser, all of Tucson, Ariz.

[73] Assignee: United Technologies Corporation, Hartford, Conn.

[21] Appl. No.: 923,783

[22] Filed: Oct. 27, 1986

[51] Int. Cl.⁴ ............................ G11C 5/04; G11C 7/00
[52] U.S. Cl. ..................................... 365/52; 365/228; 365/195
[58] Field of Search ................. 365/226, 228, 229, 52, 365/63, 195; 361/400, 401, 415

[56] References Cited

U.S. PATENT DOCUMENTS

| | | | |
|---|---|---|---|
| 4,451,742 | 5/1984 | Aswell | 365/229 |
| 4,534,018 | 8/1985 | Eckert et al. | 365/228 |
| 4,612,632 | 9/1986 | Olson | 365/226 |

Primary Examiner—Stuart N. Hecker
Assistant Examiner—Glenn A. Gossage
Attorney, Agent, or Firm—Dominic J. Chiantera

[57] ABSTRACT

Apparatus (82) for providing write protection for EEPROMs (10) intended as a replacement for installed ROM devices, includes write protection circuitry (54) mounted on one surface (88) of a circuit board (84), the other surface (86) receiving the EEPROM, providing a direct plug-in module for retrofit of installed ROM devices.

2 Claims, 2 Drawing Sheets

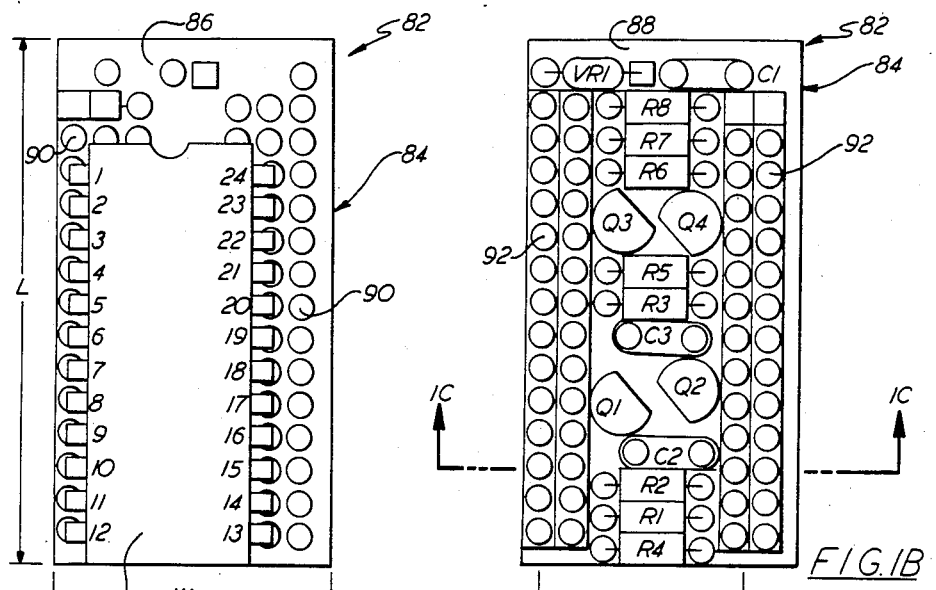
FIG. 1A
FIG. 1B
FIG. 1C
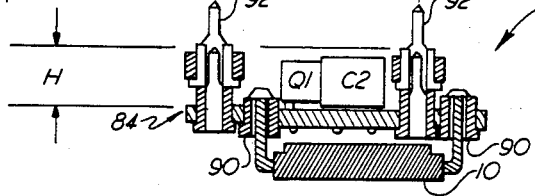
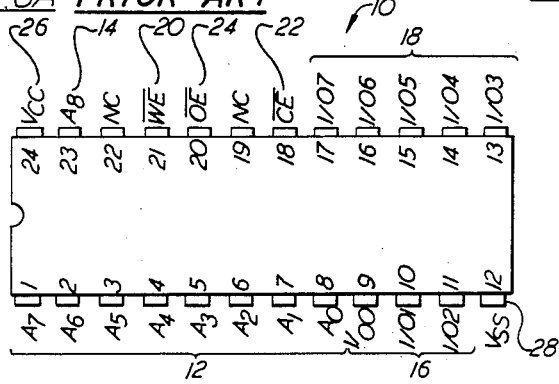
FIG. 3A PRIOR ART
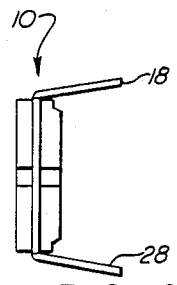
FIG. 3C PRIOR ART
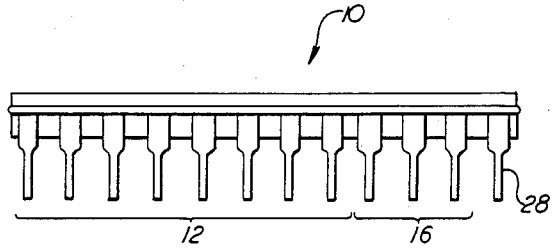
FIG. 3B PRIOR ART

EEPROM MOUNTING DEVICE

TECHNICAL FIELD

This invention relates to write protection of solid state memory devices, and more particularly to write protection of Electrically Erasable PROM (EEPROM) devices.

BACKGROUND ART

As known, Read Only Memory (ROM) or Programmable ROM (PROM) devices (referred to collectively herein as ROM) allow only reading of the information stored in the device. Writing only occurs once, when the information is initially programmed into ROM. The ROM is non-volatile. Once written, the stored information is permanently resident. It is preserved through power outages, and is unaffected by power up/power down sequences. For this reason ROMs are used to store permanent data (i.e. not subject to change) or program instruction sets. If the data or instruction set must change, the ROM must be replaced with a newly programed ROM.

More recently Electrically Eraseable, Programable ROM (EEPROM) devices have been used to replace ROMs, and also Random Access Memory (RAM) devices, in user systems. The EEPROM allows writing to ("re-programing" of) the device while installed in a system. A number of EEPROM manufacturers produce models designed to be pin-for-pin compatible with both ROM and RAM devices, in the same pin-pad layout, allowing for use of either type in a given application. In order to plug an EEPROM into a ROM socket, however, some type of write protection must be added to the system to protect the EEPROM against inadvertent "writes" during system power up/power down sequences. Therefore, field replacement of installed system ROMs with EEPROMs is difficult, or impossible.

DISCLOSURE OF INVENTION

One object of the present invention is to provide a write protection circuit for EEPROMs. Another object is to provide write protection apparatus for EEPROMs which may be installed as replacements for ROM devices.

According to the present invention, to provide memory write protection to an EEPROM having an array of pins adapted for mounting within spatial clearance dimensions to a system board array of pads, the EEPROM pins including an output enable pin and a power supply pin required, concurrently, to receive a system board logic high enable signal and a minimum voltage signal, respectively, in order to write data to the EEPROM, protection apparatus includes: a circuit board for connecting all EEPROM pins, except the output enable pin, to the system board pads and for connecting the output enable pin through write protection circuitry to the system board output enable pad, the write protection circuitry also being connected to the EEPROM power supply pin for providing a logic high signal to the EEPROM output enable pin to enable writing of data in response to the presence, concurrently, of a logic high signal at the system board output enable pad and a minimum voltage signal at the EEPROM power supply pin, and for providing a logic low signal to the EEPROM output enable pin to inhibit writing at all other times.

In further accord with the present invention, the circuit board has first and second major surfaces with dimensions not greater than the spatial clearance dimensions, the first major surface having a circuit board array of pads adapted to receive the EEPROM array of pins and the second major surface having a circuit board array of pins adapted for connection to the system board array of pads; and write protection circuitry disposed on the second major surface, and having a threshold detector connected to the EEPROM power supply pin, for providing a first signal whenever the power supply is greater than a minimum threshold voltage, and having a comparator connected to the detector and connected to the system board enable signal, for connecting the system board enable signal to the EEPROM output enable pin in the presence of the detector first signal, and for maintaining the EEPROM output enable pin at a logic low, thereby inhibiting data writing to the EEPROM, at all other times.

The memory protection device circuit board mounts between the EEPROM and the system board in which the EEPROM is to be mounted. The write protection circuitry located on the circuit board is electrically in-line between the system board and the EEPROM gate enable pin, so as to prevent direct write commands from the system to the EEPROM pin. The circuitry receives electrical power and all necessary signal inputs directly from the circuit board pins connected to the system board; nothing need be located on the system board or the EEPROM itself. As a result, the memory protection device may be connected to the system board with no system board modifications.

These and other objects, features, and advantages of the present invention will become more apparent in light of the following detailed description of a best mode embodiment thereof, as illustrated in the accompanying Drawing.

BRIEF DESCRIPTION OF DRAWING

FIG. 1A illustrates a top view of one embodiment of a EEPROM mounting device according to the present invention;

Figure 2:
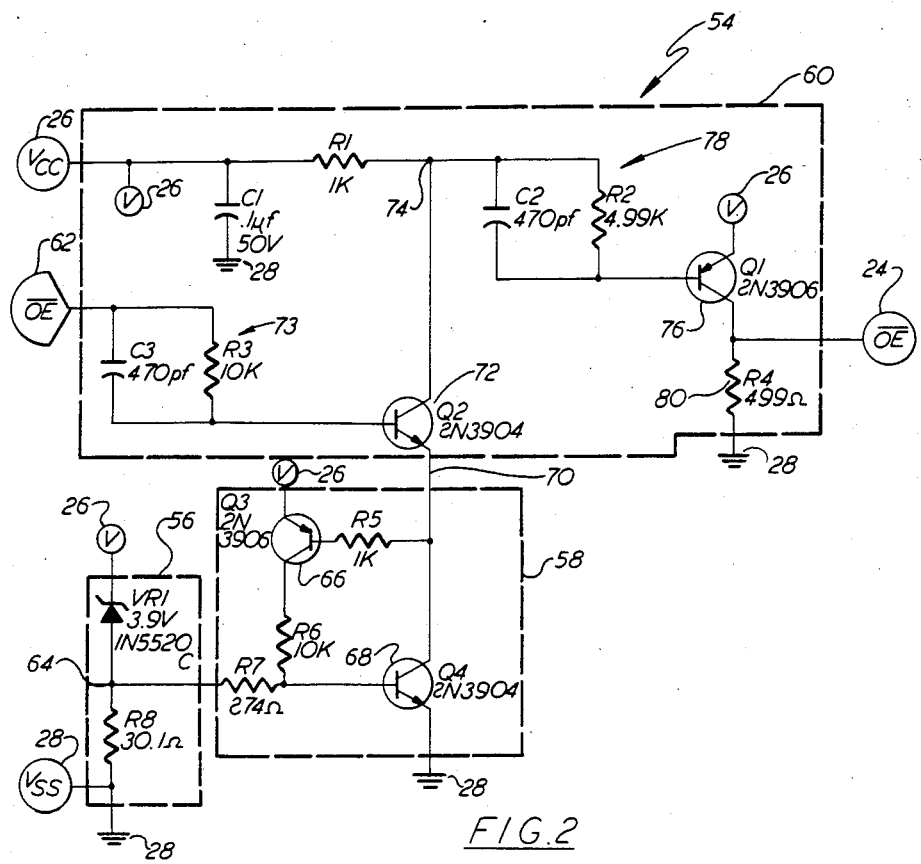

FIB 1B illustrates a bottom view of the embodiment of FIG. 1A;

FIG. 1C illustrates a section view taken along the line 1C—1C of the embodiment of FIG. 1A;

FIG. 2 is a schematic illustration of write protection circuitry used in the embodiment of FIGS. 1A, 1B and 1C;

FIG. 3A illustrates a top view of an EEPROM with which the embodiment of FIGS. 1A, 1B, and 1C may be used;

FIG. 3B illustrates a side view of the EEPROM of FIG. 3A;

FIG. 3C illustrates an end view of the EEPROM of FIG. 3A; and

Figure 4:
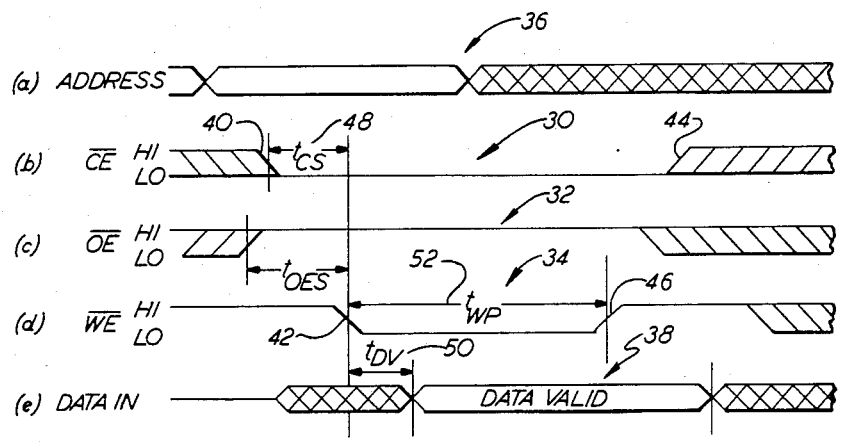

FIG. 4 is a set of waveform illustrations used in the description of operation of the EEPROM of FIGS. 3A, 3B, and 3C.

BEST MODE FOR CARRYING OUT THE INVENTION

FIGS. 3A–3C show the top, side, and end views of a 24 lead dual-in-line package 10 which is used for packaging memory devices, such as the XICOR, Inc model X2804A (4K) EEPROM. The package has a JEDEC approved pin array ("pinout") compatible with industry standard ROMs, and is typical of an EEPROM for which the present invention may be used.

FIG. 3A illustrates the pin functions for the X2804A, which include: address pins (A0-8) 12,14, data input-/output pins (I/O0-I/O7) 16,18, a write enable pin ($\overline{WE}$) 20, a chip enable pin ($\overline{CE}$) 22, and an output enable pin ($\overline{OE}$) 24. The device also includes a power supply pin (Vcc) 26, and a ground pin (Vss) 28; NC means no connection. For the X2804A, Vcc is a nominal 5 VDC (+/−5%) regulated voltage signal provided from the system board on which the EEPROM is mounted.

The $\overline{CE}$ input must be at a logic LOW to enable all read/write operations. The $\overline{OE}$ input controls the EEPROM data output buffers, and is normally used to initiate read operations. The $\overline{WE}$ input controls the write operation and must be at a logic LOW when writing to memory. FIG. 4, illustrations (a)-(e) show the necessary concurrence of the $\overline{CE}$, $\overline{OE}$, and $\overline{WE}$ logic states, with input signals 30, 32, 34, together with the address and data-in signals 36, 38. Write operations are initiated when $\overline{CE}$ and $\overline{WE}$ are both LOW, and $\overline{OE}$ is HIGH. The address 36 is latched, and the write cycle initiated, by the falling edge 40, 42 of $\overline{CE}$ or $\overline{WE}$, whichever occurs last. The written data is latched internally by the rising edge 44, 46 of $\overline{CE}$ or $\overline{WE}$, whichever occurs first.

Once the write cycle is initiated it automatically continues to completion. The time 48 between the falling edges (the write set-up time; tcs) may be zero. The maximum data valid time (tdv) 50 is 1.0 microsecond. With these low set-up times, and the lack of predictability as to signal conditions in the system board during power transients (start-up, surge, interrupt) the EEPROM must be protected against inadvertent write cycles.

The X2804A itself has three built-in write protects. To validate the write initiation, $\overline{WE}$ must have a write pulse width (twp) 52 greater than 20 microseconds. If the Vcc magnitude at pin 26 (FIG. 3A) is less than 3.0 VDC (typically 3.0 VDC) all read/write functions are inhibited. Finally, the EEPROM may be write inhibited by holding either $\overline{OE}$ LOW, $\overline{WE}$ HIGH, or $\overline{CE}$ HIGH during power-on/power-off cycles. All of these self protects are directed primarily to self inflicted faults.

In the present memory protection device, write protection is provided by holding $\overline{OE}$ LOW whenever Vcc is less than 4.5 VDC; for whatever reason. The system processor function cannot be predicted below a Vcc=4.5 VDC level. The system may generate erroneous write commands to the EEPROM, which the EEPROM may, or may not, be able to protect against; at a 3.0 VDC <Vcc> 4.5 VDC the EEPROM is not self inhibited. For this reason a higher, more precise supply voltage threshold level must be established.

FIG. 2 is a schematic of the present write protection circuitry 54, which includes: a threshold detector 56, a comparator 58, and a buffer 60. As described in detail hereinafter with respect to FIG. 1, the write protection circuitry is mounted on a circuit board, which is an intermediary connection for the EEPROM to the system board, allowing the write protection circuitry buffer to be connected between the system board $\overline{OE}$ pad 62 and the EEPROM OE pin 24. The write protection circuitry is also connected to the EEPROM Vcc pin (power supply) 26 and Vss pin (ground) 28. All of the required signals and electrical power for the circuitry are taken from the memory device being protected.

The threshold detector circuit 56 includes a zener diode and a resistor connected in series between Vcc 26 and Vss 28, to provide a detector output signal at junction 64. The zener diode is sized to provide an equivalent logic HIGH (nominal 0.6 to 1.6 VDC) output in the presence of Vcc>than the selected threshold. For the X2804A EEPROM requiring a nominal Vcc=5.0 VDC, and a threshold of +4.5 VDC, the zener diode may be a 1N5520C (3.9 VDC).

Transistors Q3 66 and Q4 68 compare the threshold detector output 64 with Vcc 26. At Vcc>4.5 VDC the detector output HIGH turns on transistor Q4, an NPN 2N3904, or equivalent, and turns on Q3, a PNP 2N3906, or equivalent. This clamps the comparator output 70 at a logic LOW. If Vcc falls below +4.5 VDC the detector output goes LOW. This turns off Q4 and Q3 to provide a logic HIGH at the comparator output. Q3 provides some degree of hysteresis.

The buffer 60 includes transistor Q2 72, an NPN 2N3904, or equivalent, with its base connected through a speed up circuit 73 to the system board $\overline{OE}$ pad 62 and with its emitter connected to the comparator output. With the comparator output at a logic HIGH, Q2 is off, no matter ("don't care") if the system $\overline{OE}$ is HIGH (write command) or LOW (not write), providing a constant logic HIGH at junction 74. When the comparator output is LOW Q2 responds to the system $\overline{OE}$ by turning on for a WRITE ($\overline{OE}$=HIGH), causing junction 74 to go LOW, and turning off for a not-write ($\overline{OE}$=LOW), causing junction 74 to go HIGH. The junction 74 signal state is opposite to that of the system $\overline{OE}$ signal state.

Transistor Q1 76, a PNP 2N3906, or equivalent, inverts the voltage signal from junction 74, which it receives through a speed up circuit 78. The Q1 collector (the buffer output) is connected to the EEPROM pin $\overline{OE}$ 24. As a result, the EEPROM $\overline{OE}$ signal state follows the system $\overline{OE}$ state whenever the comparator output is LOW (Vcc≧4.5 VDC). When the comparator output is HIGH (Vcc≦4.5 VDC) the junction 74 is HIGH, Q1 is turned off, and the EEPROM $\overline{OE}$ is clamped LOW (not-write) by pull-down resistor R4 80.

The write protection circuitry allows the EEPROM $\overline{OE}$ pin to follow the system $\overline{OE}$ input whenever the Vcc supply is above the threshold. Whenever Vcc falls below the threshold the EEPROM $\overline{OE}$ input is held LOW, inhibiting any writing of data to memory. As shown in FIG. 4 the write inhibit may also be provided by keeping the $\overline{CE}$ or $\overline{WE}$ inputs HIGH. However, a HIGH state cannot be guaranteed during low threshold conditions, or power disruption; a logic LOW can always be accomplished. It should also be understood that the illustrated write protection circuitry is only one of a number of alternative circuit configurations which may be used to achieve the same inhibit function, as known to those skilled in the art. Any alternative circuit may be used which also allows mounting of the circuit components within the clearance dimensions provided in the system board for mounting the memory device.

FIGS. 1A-1C show the top (1A), bottom (1B), and end section, (1C) views of the complete EEPROM mounting device assembly 82. The assembly includes a circuit board 84 having a first major surface 86 (e.g., top surface) and a second major surface 88 (e.g., bottom surface). The first surface includes an array of pads 90 adapted for receiving the pins (numbered 1-24 in correspondence with FIG. 3A, with pin configuration description corresponding with reference numerals 12-28 of EEPROM 10, in electrical contact. The bottom surface includes an array of pins 92 adapted for connecting to the system board EEPROM pads. All of the pads 90 are directly connected to the pins 92, with the exception of those corresponding to the EEPROM $\overline{OE}$ pin (24, FIG. 3A). The write protection circuitry components (R1, R2, Q1 etc.—See FIG. 2) are disposed on the bottom surface. FIG. 1C is an end section of the assembly taken along the line 1C—1C of FIG. 1B. It illustrates the EEPROM 10 and the components (Q1, C2) mounted on opposite sides of the circuit board 84.

In the illustrated embodiment, the circuit board pads 90 are standard socket terminal assemblies, and the circuit board pins 92 comprise strip sockets. Any type pin/pad equivalent known in the art may be used, such as the series L.S. socket terminal carrier assemblies manufactured by Augat, Inc. The circuit board pins 92 are spaced above the bottom surface at a height (H) sufficient to provide clearance of the circuit components from the system board surface. Similarly, the circuit board must have a small enough length (L) and width (W) to fit within the system board clearance dimensions for the memory device. The circuit board may be standard NEMA grade, FR4 epoxy board, with an approximate board thickness of 0.062 inches. The array of pads 90 and pins 92 are deposited on each surface of the board using known metal deposition techniques.

The memory protection device of the present invention provides EEPROM write protection in a compact mechanical package, allowing for direct plug-in of an EEPROM replacement for an installed ROM device. The assembly "footprint" on the system board is substantially the same as the footprint of the memory device alone. This allows direct replacement of the existing ROM without modification of the system board. Similarly, all the required signals and power inputs for the write protection circuitry are taken directly from the system board pads which service the EEPROM, allowing for a compact plug-in module that fits directly under the EEPROM.

Although the invention has been shown and described with respect to a best mode embodiment thereof, it should be understood by those skilled in the art that various other changes, omissions, and additions may be made therein, without departing from the spirit and the scope of the invention.

We claim:
1. Apparatus (82) for providing write protect mounting of an EEPROM (10) having a pin array (12-28) with an output enable pin (24) and a power supply pin (26), to the mounting pad array of a ROM socket disposed within ROM spatial clearance dimensions on a system board, comprising:
   circuit board means (84), having a first surface (86) with a array of pads (90) adapted to receive the EEPROM pin array, and having a second surface (88) with an array of pins (92) adapted to be inserted into the ROM socket pads to provide electrical connection of the EEPROM pins, other than the EEPROM output enable pin, to the system board ROM socket; and
   protection circuit means (54), mounted on said second surface of said circuit board means, and responsive at inputs thereof to signals appearing at the ROM socket output enable pad (62) and the EEPROM power supply pin, and having a signal output connected to the EEPROM output enable pin, said circuit means presenting a write enabling logic state signal to the EEPROM output enable pin in the presence of a write enabling logic state signal at the ROM socket output enable pad concurrent with a minimum voltage signal magnitude at the EEPROM power supply pin, and for presenting a write disabling logic state signal to the EEPROM output enable pin at all other times.
2. The apparatus of claim 1, wherein said protection circuit means comprises:
   threshold detection means (56), responsive to the signals appearing at the EEPROM power supply pin, for providing a first logic state signal in the presence of a voltage signal magnitude at the EEPROM power supply pin which is greater than a minimum signal magnitude; and
   signal comparison means, including a signal comparator (58) connected (64) to said threshold detection means and a signal buffer (60) connected (70) to said signal comparator and to the ROM socket output enable pad, for providing in the presence of said first logic state signal concurrent with said write enabling logic state signal at the ROM socket output enable pad, said write enabling logic state signal to the EEPROM output enable pin, and for providing said write disabling logic state signal to the EEPROM output enabling pin at all other times.

* * * * *